(12) United States Patent
Liu

(10) Patent No.: US 8,232,480 B2
(45) Date of Patent: Jul. 31, 2012

(54) INTERCONNECT PATTERN FOR HIGH PERFORMANCE INTERFACES

(75) Inventor: Hui Liu, Pleasanton, CA (US)

(73) Assignee: Altera Corporation, San Jose, CA (US)

( * ) Notice: Subject to any disclaimer, the term of this patent is extended or adjusted under 35 U.S.C. 154(b) by 353 days.

(21) Appl. No.: 12/702,823

(22) Filed: Feb. 9, 2010

(65) Prior Publication Data

US 2011/0192640 A1 Aug. 11, 2011

(51) Int. Cl.
 *H05K 1/11* (2006.01)
(52) U.S. Cl. .................. 174/261; 361/772; 361/777
(58) Field of Classification Search .................. 174/261; 361/772–779
See application file for complete search history.

(56) References Cited

U.S. PATENT DOCUMENTS

| | | | |
|---|---|---|---|
| 6,384,341 | B1 | 5/2002 | Rothermel et al. |
| 7,331,800 | B2 | 2/2008 | Winings et al. |
| 2003/0123236 | A1 | 7/2003 | McGrath et al. |
| 2006/0121749 | A1 | 6/2006 | Fogg |

*Primary Examiner* — Jeremy Norris
(74) *Attorney, Agent, or Firm* — Ward & Zinna, LLC

(57) ABSTRACT

In one embodiment, differential signaling and ground contacts are located in a rectilinear array of rows and columns with ground contacts spaced apart by three times the pitch distance between adjacent rows or columns and signaling contacts are located immediately adjacent the ground contacts. In particular, the two contacts of each differential pair are located one pitch distance apart from each other and one contact of each differential pair of contacts is located one pitch distance from a ground contact and the other contact of the differential pair is located approximately sqrt(2)*pitch distance from the same ground contact. In a second embodiment, differential signaling and ground contacts are located in a hexagonal array with ground contacts located three times the pitch distance between adjacent contacts and signaling contacts located immediately adjacent the ground contacts. In particular, the two contacts of each differential pair are located one pitch distance apart from each other and both contacts of each differential pair of contacts are located one pitch distance from a ground contact.

19 Claims, 4 Drawing Sheets

INTERCONNECT PATTERN FOR HIGH PERFORMANCE INTERFACES

BACKGROUND OF THE INVENTION

This relates to package design and more particularly to patterns of electrical interconnects that are used for high performance devices such as high speed differential signaling transceiver pairs and memory interfaces. As is known in the art, such interfaces are typically implemented using a ball grid array (BGA) or a pin grid array (PGA). A BGA is an area array of solder balls or solder bumps that is located on the surface of a package. A PGA is an area array of pins underneath a package surface. The BGA or PGA is used to connect the package to the next level of package. See, R. R. Tummala, *Fundamentals of Microsystems Packaging*, pp. 67, 68, 279-281, 680-682, 925 (McGraw-Hill, 2001), which is incorporated by reference herein in its entirety. For convenience, the terms "contacts" or "interconnects" will be used hereafter to refer to solder balls, solder bumps, and interconnect pins as well as similar connectors In designing high speed differential signaling interfaces, one approach has been to locate the differential signaling pairs in the vicinity of ground contacts. FIG. 1 depicts a conventional rectilinear array 100 of rows 102 and columns 104 of contact sites 110 on a substrate 120 wherein adjacent rows and adjacent columns are each spaced apart by a distance D, which is commonly referred to as the pitch. In a conventional interface, a plurality of ground contacts 130 are located at certain of the contact sites 110 spaced apart by the distance 3D or three pitch distances. A plurality of pairs of differential contacts 140, 145 are more or less randomly distributed at other contact sites 110. In FIG. 1, each differential pair is indicated by a solid line extending between a pair of contacts 140, 145. Other contacts such as contacts 160 may provide power or other signals across the interface. Some contact sites may be empty.

As will be apparent, the distance between the contacts of the differential pairs varies and is one pitch distance D in some cases and sqrt(2)*D in other cases. In some cases, two or more differential pairs are adjacent and parallel to one another such as the pairs encircled by the dotted line A or the dotted line B. These situations are likely to increase crosstalk.

As discussed below in conjunction with FIG. 4, the performance of an interconnection pattern such as that of FIG. 1 is not optimum. The differential impedance tends to vary significantly from pair to pair and the coupling coefficient is undesirably high.

SUMMARY OF THE INVENTION

The present invention is directed to interconnect patterns with improved performance relative to prior art patterns.

In one embodiment of the invention, signaling and ground contacts are located in a regular rectilinear array of rows and columns with ground contacts spaced apart by three times the pitch distance between adjacent rows or columns and the signaling contacts located immediately adjacent the ground contacts. In particular, one contact of each differential pair of contacts is located one pitch distance from a ground contact and the other contact of the differential pair is located approximately sqrt(2)*pitch distance from the same ground contact.

In another embodiment of the invention, signaling and ground contacts are located in a regular hexagonal array with ground contacts located three times the pitch distance between adjacent contacts and signaling contacts located immediately adjacent the ground contacts. In particular, both contacts of each differential pair of contacts are located one pitch distance from a ground contact.

BRIEF DESCRIPTION OF THE DRAWINGS

These and other objects, features and advantages of the present invention will be more readily apparent from the following Detailed Description in which.

DETAILED DESCRIPTION

Figure 2:
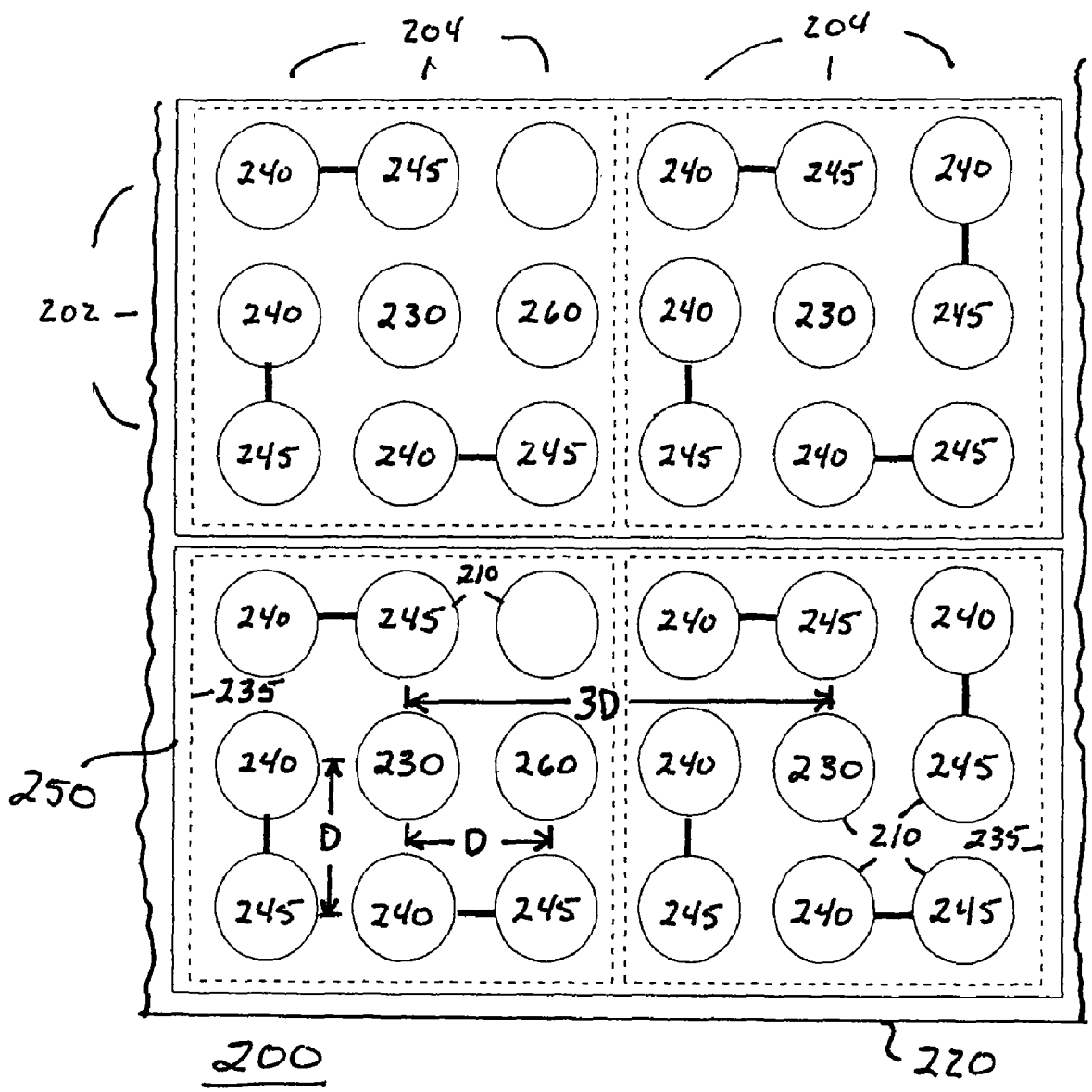
FIG. 2 depicts a first embodiment of the invention.

FIG. 2 depicts a rectilinear array 200 of rows 202 and columns 204 of contact sites 210 on a substrate 220 wherein adjacent rows and adjacent columns are each spaced apart by a distance D, which is commonly referred to as the pitch. A plurality of ground contacts 230 are located at certain of the contact sites 210 spaced apart by the distance 3D or three pitch distances. A plurality of pairs of differential contacts 240, 245 are located at other contact sites 210 with the contacts of each pair being located one pitch distance D from each other. Each pair of differential contacts is identified by a solid line extending between the pair of contacts 240, 245. One contact 240 of each pair is located in the array one pitch distance D away from a ground contact 230 and the other contact 245 of the pair is located approximately sqrt(2)*D away from the same ground contact 230. With this arrangement, both contacts of each differential pair are in the 3×3 array 235 of contacts centered on a ground contact; and if the contacts of two different differential pairs are within one pitch distance of each other in the array, the pairs are perpendicular to each other and not parallel. Moreover, the 3×3 array of contacts can be replicated without forcing two differential pairs to be adjacent and parallel to one another with each contact of one pair the same distance from a corresponding contact of another adjacent pair.

Substrate 220 may be any surface containing circuitry that is to be connected to circuitry on another surface. For example, it may be a semiconductor integrated circuit, or a chip carrier, or a circuit board. As indicated above, the contacts may be pins, solder balls, solder bumps or similar connectors. The differential contacts typically carry high speed differential signals such as low voltage differential signals (LVDS) or high speed differential strobe signals (DQS) such as used in high performance memory interfaces. Other contacts such as contacts 260 may be used to supply power or other signals across the interface and some contact sites may be empty.

The pattern of contacts shown in FIG. 2 preferably is a repeating pattern that is made by stepping and repeating a pattern of contacts across the entire array 200 of contact sites. Illustratively, the repeating pattern is the pattern of 18 contacts defined by rectangular box 250.

Figure 3:
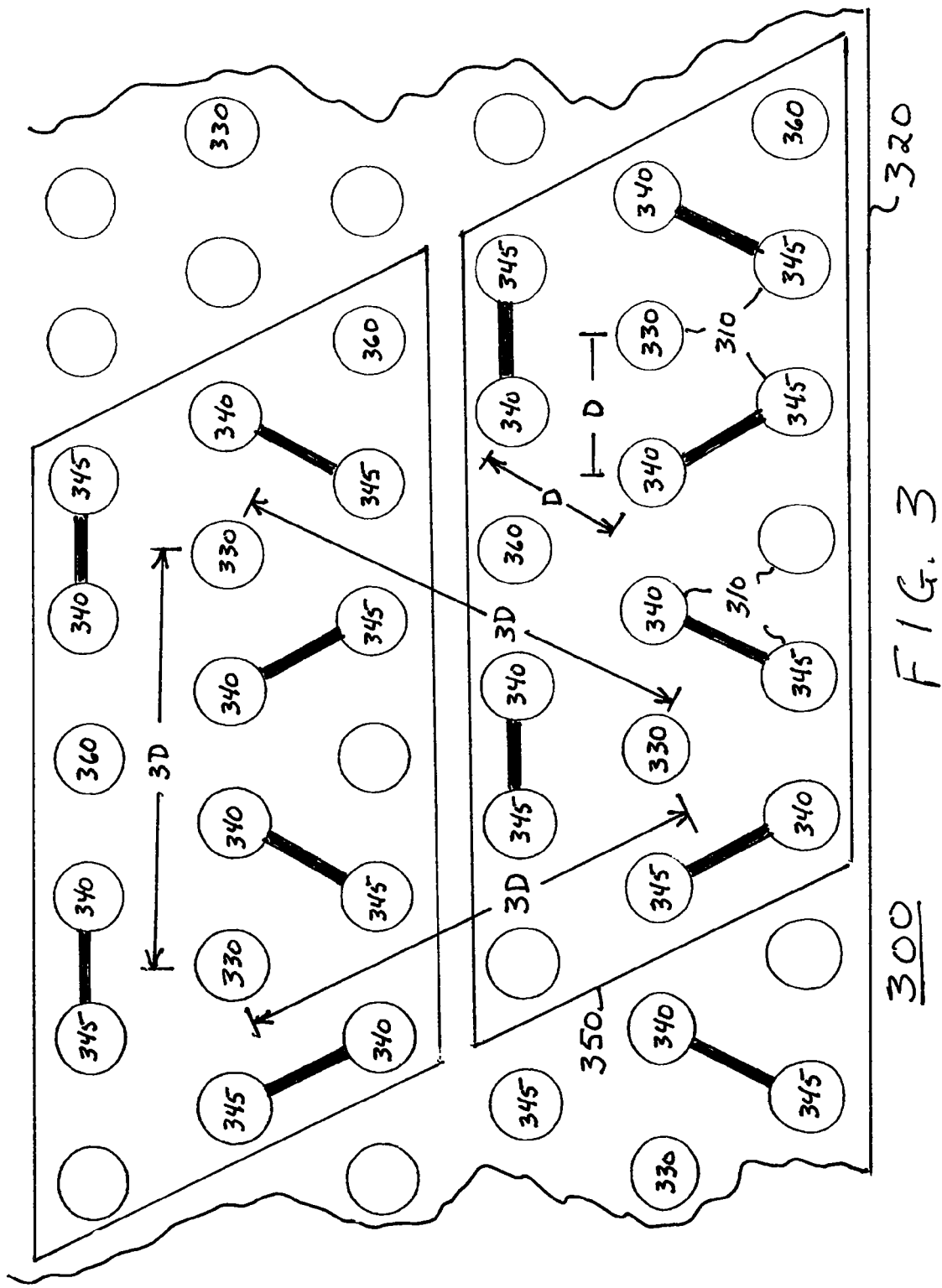
FIG. 3 depicts a second embodiment of the invention.

FIG. 3 depicts a regular hexagonal array 300 of contact sites 310 on a substrate 320 wherein adjacent contact sites are spaced apart by a distance D, which is commonly referred to as the pitch, in each of three directions at 60 degrees to each other. A plurality of ground contacts 330 are located at certain of the contact sites spaced apart by the distance 3D or three pitch distances. A plurality of pairs of differential contacts 340, 345 are located at other contact sites 310 with the contacts of each pair being located one pitch distance D from each other. Each pair of contacts is identified by a solid line extending between the pair of contacts 340, 345. Both contacts of each pair are located one pitch distance D from the same ground contact 330. With this arrangement, the contacts of the differential pairs surround the ground contacts and no differential pairs are adjacent and parallel to one another. In addition, the pattern can be replicated without bringing differential pairs into positions where they are adjacent and parallel to one another.

Again, substrate 320 may be any surface containing circuitry that is to be connected to circuitry on another surface; and the contacts may be pins, solder balls, solder bumps or other connectors. Other contacts such as contacts 360 may be used to supply power or other signals across the interface and some contact sites may be empty.

The pattern shown in FIG. 3 is a repeating pattern that is made by stepping and repeating a pattern of contacts across the entire array 300 of contact sites. Illustratively, the repeating pattern is the pattern of 18 contacts defined by box 350.

Figure 1:
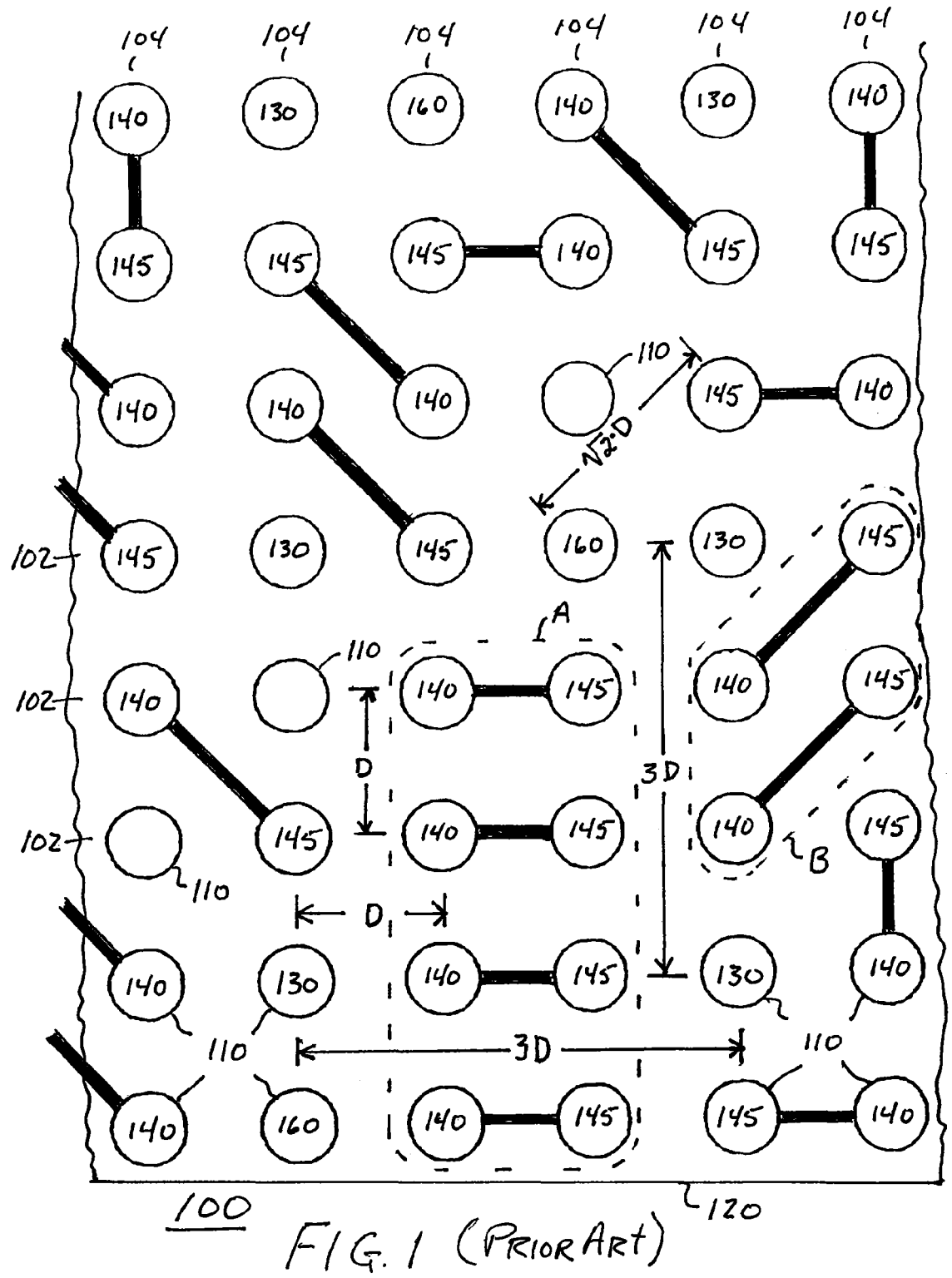
FIG. 1 depicts a conventional contact pattern for distributing ground contacts and differential signaling contacts.
Figure 4:
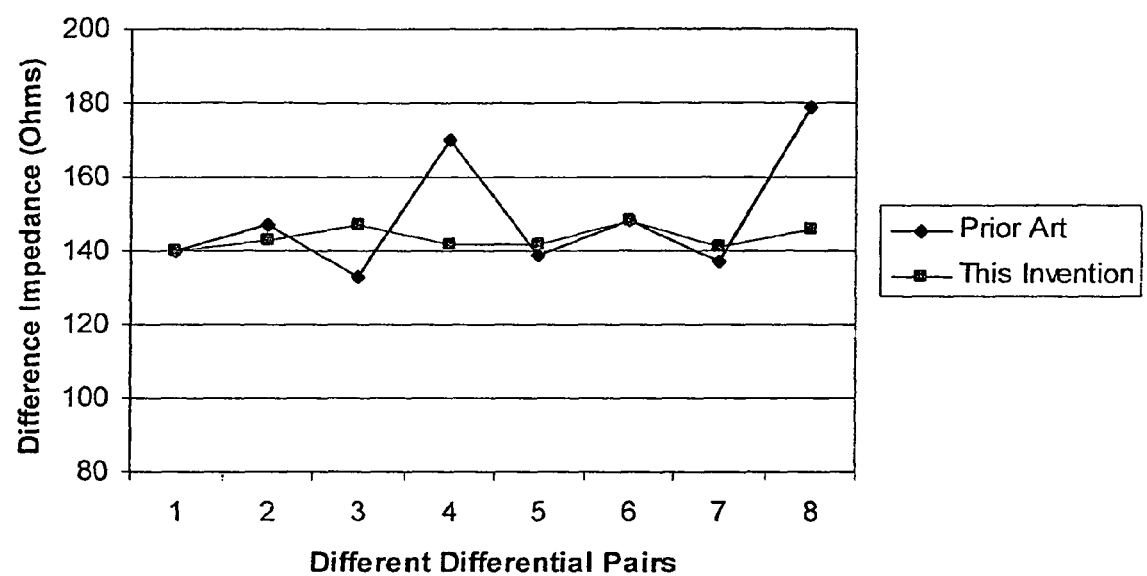
FIG. 4 is a plot of differential impedance for the patterns depicted in FIGS. 1 and 2.

While the interconnect pattern of FIG. 2 has the same number of ground contacts as that of the pattern of FIG. 1, the performance of the pattern of FIG. 2 is significantly improved. As shown in FIG. 4, the differential impedance for different signal pairs in the pattern of FIG. 2 ranges between about 140 and 150 Ohms and has significantly less variation than the differential impedance seen in an interconnect pattern such as that of FIG. 1. Cross-talk is also improved significantly. With the interconnect pattern of FIG. 2, the worst coupling coefficient observed between two pairs of contacts was 0.073 while the worst coupling coefficient observed between two pairs with the interconnect pattern of FIG. 1 was 0.082. The worst aggregate coupling coefficient observed from all neighbors was 0.132 for the interconnection pattern of FIG. 2 while the worst aggregate coupling coefficient observed from all neighbors for the interconnection pattern of FIG. 1 was 0.169. Thus, the pattern of FIG. 2 reduces the worst case coupling coefficient between two pairs by about 11% and the worst case aggregate coupling coefficient by about 22%.

The hexagonal array of FIG. 3 does not reduce cross-talk as much as the rectilinear array of FIG. 2 because the differential pairs are not at right angles to each other. However, it does permit a greater density of contact sites and a uniform spacing between the ground contact and both contacts of the differential pair and may be useful where these properties are advantageous.

As will be apparent to those skilled in the art, numerous variations of the above may be practiced within the spirit and scope of the invention.

What is claimed is:

1. In a regular array of contact sites spaced apart on a substrate by a distance of one pitch in at least first and second directions, a plurality of contacts comprising:
   a plurality of ground contacts located at certain of said contact sites and spaced apart by three pitch distances in said first and second directions; and
   a plurality of pairs of differential contacts, each contact located at a contact site, the contacts of each pair spaced apart from each other by one pitch distance, one contact of each pair of differential contacts being located in the array one pitch distance away from a ground contact and the other contact of each pair being located no more than approximately sqrt(2)*pitch distance away from the same ground contact and no two differential pairs being located in the array so that they are parallel to one another with each contact of one pair located one pitch distance away from a corresponding contact of the other pair.

2. The plurality of contacts of claim 1 wherein the contacts are solder balls or solder bumps.

3. The plurality of contacts of claim 1 wherein the contacts are pins.

4. The plurality of contacts of claim 1 wherein the first and second directions are perpendicular to one another.

5. The plurality of contacts of claim 1 wherein the first and second directions are at an angle of approximately 60 degrees to one another.

6. The plurality of contacts of claim 5 wherein both contacts of each differential pair are located approximately one pitch distance from the same ground contact.

7. The plurality of contacts of claim 1 wherein at least some of the differential contacts are signaling contacts.

8. The plurality of contacts of claim 1 wherein at least some of the differential contacts are control contacts.

9. The plurality of contacts of claim 1 wherein at least some of the differential contacts are memory strobe signals.

10. In a regular rectilinear array of contact sites spaced apart on a substrate by a distance of one pitch in first and second mutually perpendicular directions, a plurality of contacts comprising:
    a plurality of ground contacts located at certain of said contact sites and spaced apart by three pitch distances in said first and second directions; and
    a plurality of pairs of differential contacts, each contact located at a contact site, the contacts of each pair spaced apart from each other by one pitch distance, one contact of each pair of differential contacts being located in the array one pitch distance away from a ground contact and the other contact of each pair being located approximately sqrt(2)*pitch distance away from the same ground contact and no two differential pairs being located in the array so that they are parallel to one another with each contact of one pair located one pitch distance away from a corresponding contact of the other pair.

11. The plurality of contacts of claim 10 wherein the contacts are solder balls or solder bumps.

12. The plurality of contacts of claim 10 wherein the contacts are pins.

13. The plurality of contacts of claim 10 wherein at least some of the differential contacts are signaling contacts.

14. The plurality of contacts of claim 10 wherein at least some of the differential contacts are control contacts.

15. A rectilinear array of rows and columns of contacts spaced apart on a substrate by a distance on one pitch in first and second mutually perpendicular directions, said array comprising:
    a plurality of ground contacts spaced apart in the array by three pitch distances in said first and second directions; and
    a plurality of pairs of differential contacts, the contacts of each pair spaced apart from each other by one pitch distance, one contact of each pair of differential contacts being located in the array one pitch distance away from a ground contact and the other contact of each pair being located approximately sqrt(2)*pitch distance away from the same ground contact and no two differential pairs being located in the array so that they are parallel to one another with each contact of one pair located one pitch distance away from a corresponding contact of the other pair.

16. The array of claim 15 wherein the contacts are solder balls or solder bumps.

17. The array of claim 15 wherein the contacts are pins.

18. The array of claim 15 wherein at least some of the differential contacts are signaling contacts.

19. The array of claim 15 wherein at least some of the differential contacts are control contacts.

* * * * *